United States Patent
Buenning

(10) Patent No.: US 10,410,922 B2
(45) Date of Patent: Sep. 10, 2019

(54) SEMICONDUCTOR DEVICE WITH SIX-SIDED PROTECTED WALLS

(71) Applicant: NXP B.V., Eindhoven (NL)

(72) Inventor: Hartmut Buenning, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/440,522

(22) Filed: Feb. 23, 2017

(65) Prior Publication Data

US 2018/0240707 A1    Aug. 23, 2018

(51) Int. Cl.
| | |
|---|---|
| H01L 21/78 | (2006.01) |
| H01L 21/56 | (2006.01) |
| H01L 21/683 | (2006.01) |
| H01L 23/00 | (2006.01) |
| H01L 23/29 | (2006.01) |
| H01L 23/31 | (2006.01) |

(52) U.S. Cl.
CPC ............ H01L 21/78 (2013.01); H01L 21/561 (2013.01); H01L 21/6836 (2013.01); H01L 23/293 (2013.01); H01L 23/3114 (2013.01); H01L 24/94 (2013.01); *H01L 2221/6834* (2013.01); *H01L 2221/68327* (2013.01)

(58) Field of Classification Search
CPC .................. H01L 21/56; H01L 21/561; H01L 2221/68327; H01L 24/96; H01L 21/563; H01L 21/568
See application file for complete search history.

(56) References Cited

U.S. PATENT DOCUMENTS

| | | |
|---|---|---|
| 6,573,156 B1 | 6/2003 | Wang |
| 8,026,599 B2 | 9/2011 | O'Donnell |
| 9,466,585 B1 | 10/2016 | Kamphuis et al. |
| 9,704,823 B2 | 7/2017 | Kamphuis et al. |

(Continued)

OTHER PUBLICATIONS

Lin, Y. et al. "Encapsulated Wafer Level Chip Scale Package (eWLCSP™) for Cost Effective and Robust Solutions in FlexLine™", 2014 9th International Microsystems, Packaging, Assembly and Circuits Technology Conference, 158-161 pgs. (2014).

(Continued)

*Primary Examiner* — David C Spalla

(57) ABSTRACT

A method of manufacturing a device with six-sided protected walls is disclosed. The method includes fabricating the plurality of devices on a wafer, forming a plurality of contact pads on each of the plurality of devices, cutting a first trench around each of the plurality of devices from a backside of the wafer with an active side having a plurality of contact pads facing down, applying a protective coating on the backside of the wafer thus filling the first trench with a protective material of the protective coating on the backside and cutting a second trench from the active side. The second trench extends to end of the first trench; The method further includes applying a protective layer on the active side including filling the second trench with the material of the protective coating on the active side thus making a wall through a combination of the first trench and the second trench, the wall fully filled with the material of the protective layer on the backside and the protective layer on the active side and singulating each of the plurality of devices by cutting through the wall substantially in middle across a thickness of the wafer.

7 Claims, 4 Drawing Sheets

(56) References Cited

U.S. PATENT DOCUMENTS

| | | |
|---|---|---|
| 10,177,111 B2 | 1/2019 | Kamphuis et al. |
| 2001/0016400 A1 | 8/2001 | Lee |
| 2008/0213976 A1 | 9/2008 | Farnworth |
| 2009/0189258 A1 | 7/2009 | Mariani |
| 2015/0270237 A1* | 9/2015 | Chi ........................ H01L 23/528 257/737 |
| 2016/0276306 A1* | 9/2016 | Kamphuis ................ H01L 24/94 |
| 2016/0322273 A1 | 11/2016 | Wu et al. |
| 2017/0032981 A1* | 2/2017 | Chinnusamy ......... H01L 21/784 |
| 2017/0256453 A1* | 9/2017 | Yada ................... H01L 21/3043 |
| 2017/0345779 A1* | 11/2017 | Lin ..................... H01L 23/3114 |

OTHER PUBLICATIONS

European Search Report, 18154192, dated Jul. 11, 2018.

* cited by examiner

SEMICONDUCTOR DEVICE WITH SIX-SIDED PROTECTED WALLS

BACKGROUND

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Ever decreasing size of electronic systems demands smaller and thinner electronic components. An electronic component such as an integrated circuit typically uses a small piece of silicon wafer. However, its final size becomes much bigger after packaging and adding contact pins. Solder balls or pads are increasingly being used on the bottom of integrated circuits or even discrete components to replace conventional metal pins and wire bonds. However, to improve system reliability, a semiconductor component mostly needs to be packaged to provide sidewall protection and preventing cracks.

The packaging of an IC device is increasingly playing a role in its ultimate performance. For example, in mobile devices (i.e., mobile phones, tablet computers, laptop computers, remote controls, etc), Wafer Level Chip Scale Packaging (WLCSP) components are used in their assembly. WLCSP components save valuable space in the mobile device. After assembly, in some example processes, customers encapsulate these WLCSP devices by injection molding or casing. This manual post-processing of the bare WLCSP may result in device damage; therefore, generally, handling of the WLCSP devices should be minimized.

When device size is small, for example in millimeters or less, unprotected sidewalls may touch solder material and the device may malfunction. FIG. 1 shows a section of a system 100 in which a device 102 is shown as being soldered to solder pads on a printed circuit board (PCB). As depicted, due to a small size, there is a likelihood that solder material 104 may touch sidewalls of the device 102.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a method of manufacturing a device with six-sided protected walls is disclosed. The method includes fabricating the plurality of devices on a wafer, forming a plurality of contact pads on each of the plurality of devices, cutting a first trench around each of the plurality of devices from a backside of the wafer with an active side having a plurality of contact pads facing down, applying a protective coating on the backside of the wafer thus filling the first trench with a protective material of the protective coating on the backside and cutting a second trench from the active side. The second trench extends to end of the first trench; The method further includes applying a protective layer on the active side including filling the second trench with the material of the protective coating on the active side thus making a wall through a combination of the first trench and the second trench, the wall fully filled with the material of the protective layer on the backside and the protective layer on the active side and singulating each of the plurality of devices by cutting through the wall substantially in middle across a thickness of the wafer.

In some embodiments, the material of protective layers includes one of Parylene and polytetrafluoroethylene. Other materials with similar electrical and mechanical properties may be used. The depth of the first trench is approximately half the thickness of the wafer. The protective layer on the backside and the protective layer on the active side are deposited in gaseous or liquid form and cured to harden the material. A dicing tape and a grinding tape is used to cover the protective layer on the active side before cutting the first trench on the backside. The protective layer on the active side is grinded to expose the plurality of contact pads prior to the singulation. The first trench and the second trench are cut using one of a mechanical tool, laser or etching.

In yet another embodiment a device manufacturing using the above methods is disclosed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
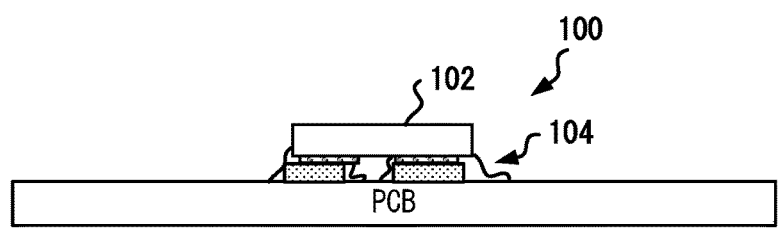
FIG. 1 depicts a section of a device soldered to pads on a printed circuit board (PCB)

Note that figures are not drawn to scale. Intermediate steps between figure transitions have been omitted so as not to obfuscate the disclosure. Those intermediate steps (e.g., applying photoresist) are known to a person skilled in the art.

DETAILED DESCRIPTION

Systems being built today are much smaller than before when factoring features and computing power they offer. More and more components are being packed into these small products year after year. The number of components in per unit area on a semiconductor wafer have also been going up year after year. It is well known that a plurality of same devices is formed on a semiconductor wafer and then each of these devices are cut from the wafer and packaged into a plastic like cover to protect the delicate device inside. Pins are added prior to packaging to provide a way for an external circuit to connect with the device inside the package. The packaging and pins increase the overall size of the device substantially. Technologies have been developed to replace pins with solder balls on the bottom of a device. However, having these solder balls attached to the bottom of a device creates issue because normal packaging technologies can no longer be used. Further, if the device is used on a system board without packaged, the issues relating to sidewall isolation/protection and preventing cracks become prominent. Further, since the device size may be very small it is desirable that the packaging process must be completed prior to cutting these devices from the wafer because it may be expensive to develop special machines that can handle all sizes of devices individually without damaging them during packaging steps while providing high yield. It will be apparent from the following description that the methods described herein can be accomplished using the same technologies and processes that are used for device fabrication. Further, devices on the entire wafer can be packaged simultaneously, thus providing high yield and reducing overall cost.

Conventionally, as described in "Encapsulated Wafer Level Pack Technology (eWLCS)" by Tom Strothmann, IEEE 2014, the wafer is diced prior to the wafer level packaging process. The dice are then reconstituted into a new wafer form with adequate distance between the die to allow for a thin layer of protective coating to remain after final singulation. This process is prone to defects as it is difficult to handle small dies and to ensure uniform distance between dies during the reconstruction of the new wafer. This prior art process also require process steps (e.g., reconstruction of the new wafer from a plurality of dies) that are not used in standard semiconductor fabrication process. Further, since the protective coating is applied from the active side of the wafer, the prior art process requires protecting solder pads prior to the application of the protective coating. The methods described herein do not require singulation of dies prior to the application of a thin protective coating and since the process of applying the protective coating is performed from the backside of the wafer, the protection of solder pads is not needed.

Figure 2:
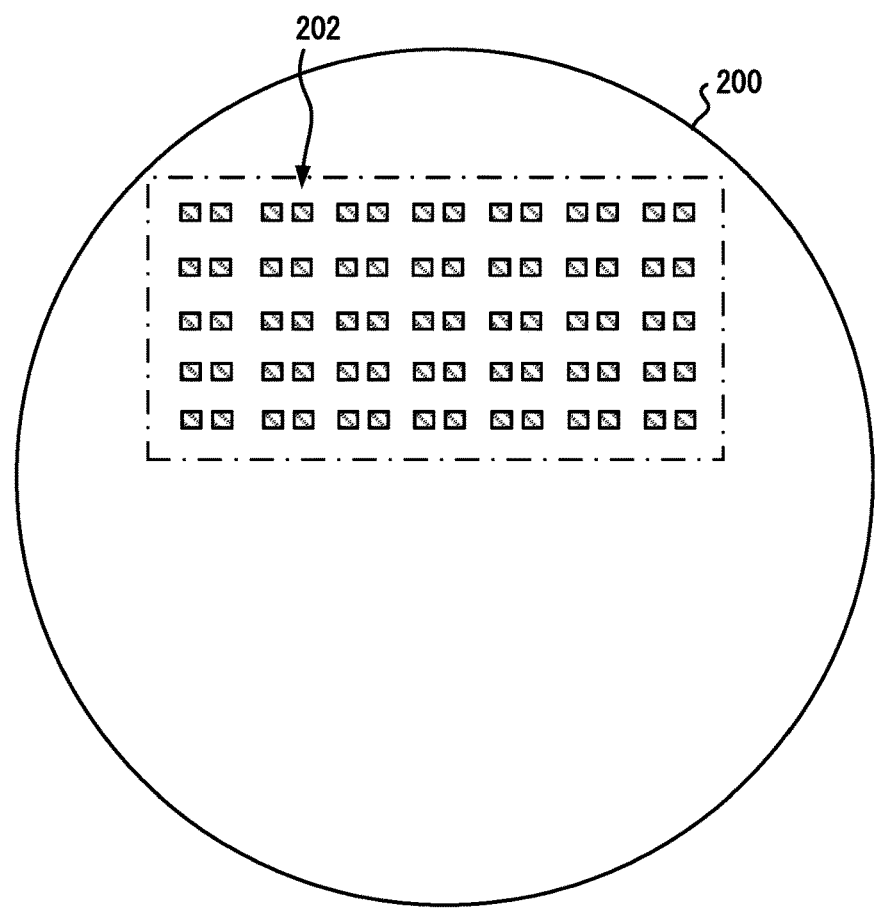
FIG. 2 illustrates a plurality of contact pads of devices fabricated in a wafer in accordance with one or more embodiments of the present disclosure.

FIG. 2 is a top level schematic of a wafer 200 in which a plurality of devices 202 had been fabricated using standard manufacturing technologies. The grid of blocks shows contact pads of the plurality of devices 202. Traditionally, each of the plurality of devices 202 are cut from the wafer 200 and packaged. Mechanical tools or laser or etching may be used to separate out the plurality of devices 202 from the wafer.

Figure 3:
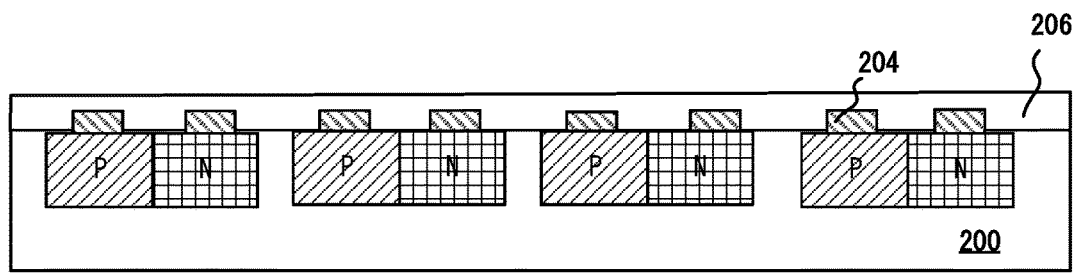
FIG. 3 shows a cross section of the wafer showing contact pads attached to doped regions in accordance with one of more embodiments of the present disclosure.

FIG. 3 shows a cross section of the wafer 200 showing individual devices and contact pads 204. A protection layer (e.g., grinding tape) 206 may be placed over the contact pads 204. The depicted device is a diode having P and N regions. Note however that the diode is shown only for example only. The device could also be a transistor or a group of components and each of the plurality of devices 202 may include more than two contact pads.

Figure 4:
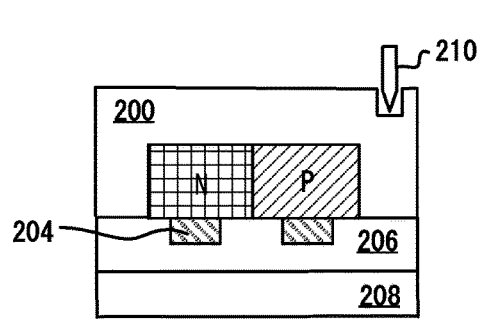
FIGS. 4-8, 8A, 9-11 depict various steps of adding packaging to the device in accordance with one of more embodiments of the present disclosure.

FIG. 4 depicts only a part of the wafer 200 for clarity purposes. The wafer 200 is put on a dicing frame 208 (e.g., dicing/grinding foil stack if the wafer 200 is being processed in grinder/mounter cluster line) with active side down (e.g., contact pads 204 facing down). Using infrared alignment, a first trench is cut, from the backside of the wafer 200, along the periphery of each of the plurality of devices 202. The first trench may be cut using a mechanical tool 210 or laser or using the etching process. The depth of the first trench may be approximately half the thickness of the wafer 200.

A person skilled in the art would know that if the etching is used, the rest of the backside of wafer 200 is covered by a photoresist and only the border lines or periphery of each of the devices 202 is exposed. The width of the first trench may depends on a desired final dimension of each of the devices 202 or may also depend on the space between two consecutive devices on the wafer 200.

Figure 5:
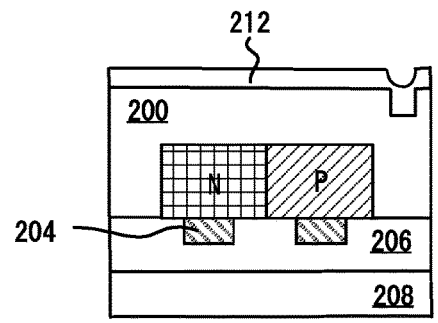
Figure 6:
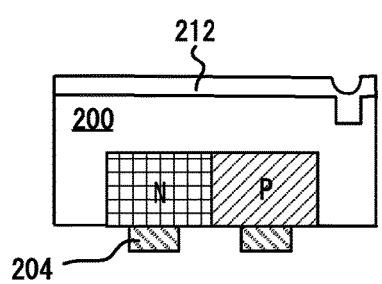
Figure 7:
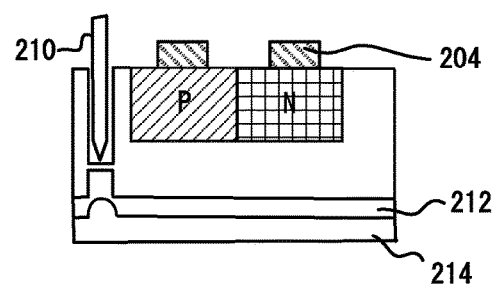

FIG. 5 shows that after forming the first trench, a protective layer 212 is formed on the backside of the wafer 200 such that the protective material of the protective layer 212 fills the first trench. The protective layer 212 may use a material that solidify upon curing and is durable to protect the devices 202 (e.g., the material does not crash upon physical impact). The protective material is also electrical insulator and does not melt under normal manufacturing process in which the devices are incorporated in electronic gadgets. Parylene or other materials with similar mechanical and adhesive properties may be used. For example, PTFE (polytetrafluoroethylene) or may be used instead of Parylene. In some embodiments, Lintec LC2841 (typically 40 μm thick) manufactured by Lintec Corporation may be used. FIG. 6 shows that the grinding tape 206 and dicing tape 208 are removed and the protective layer 212 is cured to solidify the protective layer 212. FIG. 7 shows that the wafer 200 is placed on a dicing tape 214 with the protective layer 212 facing down and the active side facing up. A second trench is then formed using the same or similar methods of forming the first trench. The second trench is aligned such that the second trench goes all the way up to where the first trench ended, leaving no wafer material between the first and the second trenches.

Figure 8:
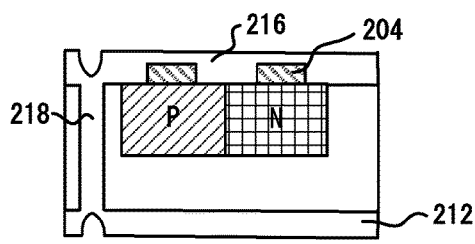
Figure 8A:
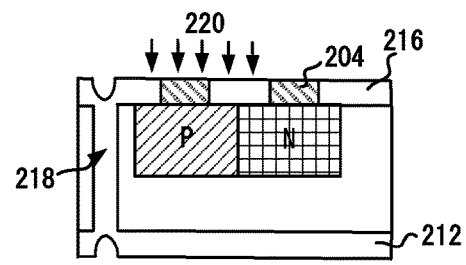

A protective layer 216 is then formed on the active side of the wafer 200 using the same material as used in the protective layer 212. The material of the protective layer 216 fills the second trench such that this filling goes up to the material of the protective layer 212 that filled the first trench. After this filling the first trench and the second trench are fully filled with the protective material to make a uniform wall 218 of the protective material. The protective layer 216 is cured to solidify the material of the protective layer 216. FIG. 8A shows that the protective layer 216 is grinded 220 to expose contact pads 204.

Figure 9:
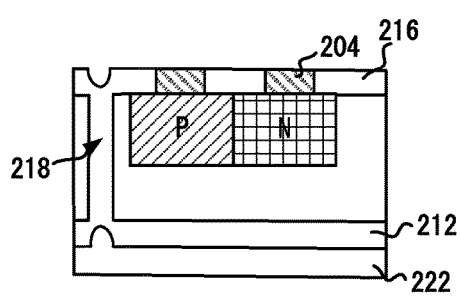
Figure 10:
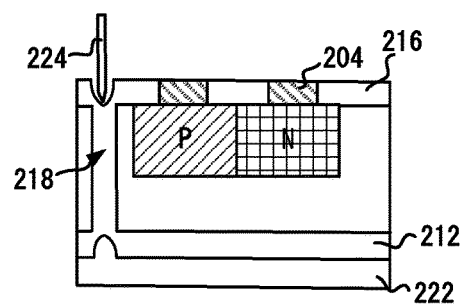
Figure 11:
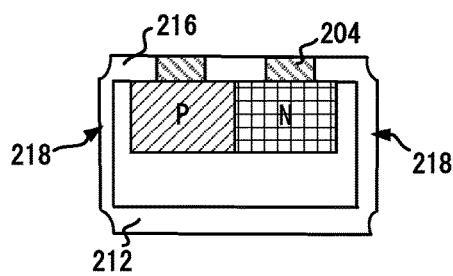

FIG. 9 shows that the wafer 200 is then placed of a dicing tape 222 with active side up. FIG. 10 shows that a narrow trench is cut inside the wall 218 such that the narrow trench is thinner than the width of the wall 218. This way a thin layer of the protective material still remains on the side walls that encapsulate the wall 218. Making this thin trench to singulate each of the devices 202 from other devices on the wafer 200. FIG. 11 shows one device that is singulated from other devices. As shown, the device is covered with the protective material on all sides with top surface of contact pads 204 exposed. It should be noted that in some embodiments, some of the steps described above may be performed in different sequence than described above.

Figure 12:
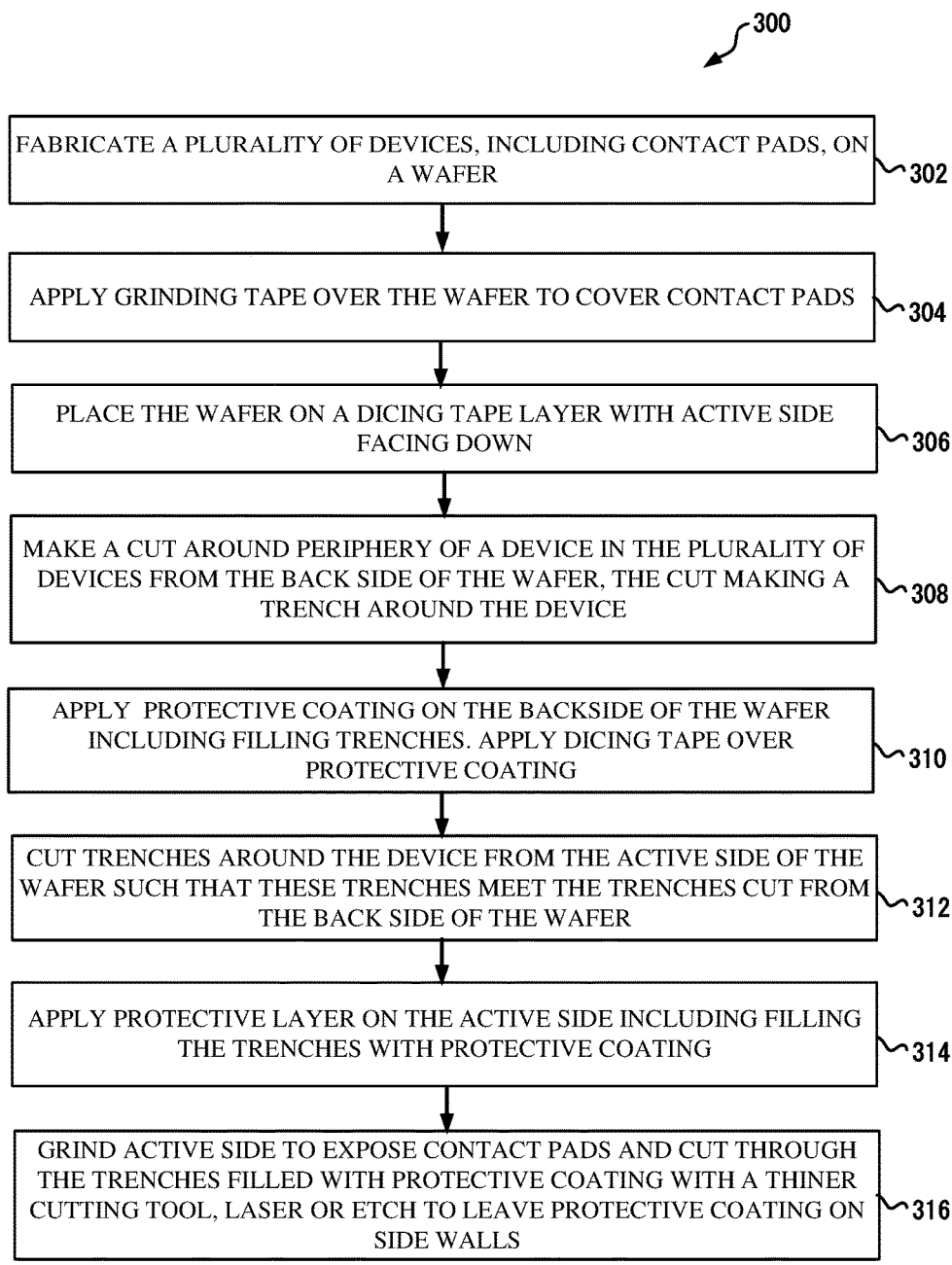
FIG. 12 depicts a method of packaging the device in accordance with one of more embodiments of the present disclosure.

FIG. 12 shows a method 300 of manufacturing electronic devices each covered with a protective layer on all sides. Accordingly, at step 302, a plurality of devices 202 are fabricated on a wafer 200. Each of the plurality of devices 202 are physically separated from each other on the wafer 200. The width of separation may depend on the number of devices 202 fabricated on the wafer 200. Required number of contact pads 204 are affixed to each of the plurality of devices 202. The number of contact pads per device depends on the type of device. For example, a diode may have at least two and a transistor may have at least three contact pads.

At step 304, a grinding tape or similar material is placed to cover the surface of the wafer 200 such that the contact pads of the plurality of devices 202 are completely buried in this grinding tape layer. At step 306, the wafer 200 is placed on a dicing tape with active side down (e.g., contact pads facing down). At step 308, on the backside of the wafer 200 that is facing up, a cut or a trench is form to mark borders of each of the plurality of devices 202. The depth of the trench may be approximately half the thickness of the wafer 200.

At step 310 a protective coating is applied on the backside of the wafer 200 such that the material of the protective layer also fills the trench. At step 312, the wafer 200 is placed with active side up and a trench is cut such that this second trench goes all the to the end of the previously cut trench. No wafer material is left in the trench. At step 314, a protective layer is formed such that the material of the protective layer fills the second trench. At step 316, the protective layer on the active side is grinded to expose contact pads and a thin trench is then cut in the previously formed trench that is filled with the material of the protective layer and the material has been cured. This thin trench separates each device from the wafer 200. The thickness of this thin trench is such that a layer of the protective material remains on the side walls of each device.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A method of manufacturing a device with six-sided protected walls, the method comprising:
    (a) fabricating the plurality of devices on a wafer;
    (b) forming a plurality of contact pads on each of the plurality of devices;
    (c) cutting a first trench into the wafer around each of the plurality of devices from a backside of the wafer with an active side having a plurality of contact pads facing down;
    (d) applying a first protective layer on the backside of the wafer thus filling the first trench with a protective material of the first protective layer on the backside;
    (e) cutting a second trench into the wafer from the active side, wherein the second trench extends to an end of the first trench leaving no wafer material between the first and second trenches;
    (f) applying a second protective layer on the active side including filling the second trench with a protective material of the second protective layer on the active side thus making a uniform wall of protective material through a combination of the first trench and the second trench, the wall fully filled with the protective material of the first protective layer and the protective material of the second protective layer; and
    (g) singulating each of the plurality of devices by cutting through the wall substantially in the middle, across a thickness of the wafer, wherein the cut is thinner than the width of the wall,
    wherein steps (a) to (g) are performed sequentially in the listed order.

2. The method of claim 1, wherein the protective material of the first and second protective layers includes one of Parylene and polytetrafluoroethylene.

3. The method of claim 1, wherein a depth of the first trench is approximately half the thickness of the wafer.

4. The method of claim 1, wherein the first protective layer on the backside and the second protective layer on the active side are deposited in gaseous or liquid form and cured to harden the material.

5. The method of claim 1, wherein a dicing tape and a grinding tape is used to cover the second protective layer on the active side before cutting the first trench on the backside.

6. The method of claim 1, wherein the second protective layer on the active side is grinded to expose the plurality of contact pads prior to the singulation.

7. The method of claim 1, wherein the second first trench and the second trench are cut using one of a mechanical tool, laser or etching.

* * * * *